United States Patent
Farkas et al.

(10) Patent No.: US 7,292,454 B2
(45) Date of Patent: Nov. 6, 2007

(54) SYSTEM AND METHOD FOR OPTIMIZING PRINTED CIRCUIT BOARDS TO MINIMIZE EFFECTS OF NON-UNIFORM DIELECTRIC

(75) Inventors: Sandor Tibor Farkas, Pflugerville, TX (US); Jimmy D. Pike, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 277 days.

(21) Appl. No.: 11/004,356

(22) Filed: Dec. 3, 2004

(65) Prior Publication Data

US 2006/0120059 A1     Jun. 8, 2006

(51) Int. Cl.
*H05K 1/11* (2006.01)
*H05K 1/14* (2006.01)

(52) U.S. Cl. .................. 361/784; 361/777; 361/778
(58) Field of Classification Search ........ 174/250–256; 361/777–778
See application file for complete search history.

(56) References Cited

U.S. PATENT DOCUMENTS

| | | | |
|---|---|---|---|
| 4,470,660 A | 9/1984 | Hillegonds et al. ...... 350/96.21 |
| 4,942,373 A | 7/1990 | Ozawa et al. ............... 333/161 |
| 5,260,892 A | 11/1993 | Testa ........................... 365/63 |
| 5,348,792 A * | 9/1994 | Hattori et al. .............. 428/209 |
| 5,467,040 A | 11/1995 | Nelson et al. .............. 327/276 |
| 5,507,029 A | 4/1996 | Granato et al. ............. 395/500 |
| 5,554,960 A * | 9/1996 | Ohnuki et al. .............. 333/132 |
| 5,633,479 A * | 5/1997 | Hirano ........................ 174/255 |
| 5,682,124 A * | 10/1997 | Suski ............................. 333/1 |
| 5,691,692 A | 11/1997 | Herbstritt .................... 340/438 |
| 5,861,764 A | 1/1999 | Singer et al. ................. 326/93 |
| 5,867,448 A | 2/1999 | Mann .......................... 365/233 |
| 6,184,478 B1 * | 2/2001 | Imano et al. ................ 174/261 |
| 6,311,313 B1 | 10/2001 | Camporese et al. ........... 716/6 |
| 6,526,519 B1 | 2/2003 | Cuthbert ..................... 713/503 |
| 6,647,027 B1 | 11/2003 | Gasparik et al. ............ 370/519 |

* cited by examiner

Primary Examiner—Tuan T. Dinh
(74) Attorney, Agent, or Firm—Baker Botts L.L.P.

(57) ABSTRACT

A system and method for minimizing the effects of non-uniform dielectric properties includes forming traces on printed circuit boards (PCB) where the fibers within the printed circuit boards are non-rectangular with respect to the rectangular edges of the circuit board. The orientation of the traces with respect to the fibers substantially minimizes the effects of non-uniform dielectric properties of the PCB.

18 Claims, 3 Drawing Sheets

SYSTEM AND METHOD FOR OPTIMIZING PRINTED CIRCUIT BOARDS TO MINIMIZE EFFECTS OF NON-UNIFORM DIELECTRIC

TECHNICAL FIELD

The present invention is related to the field of computer systems and more specifically to a system and method for optimizing printed circuit board materials to minimize the effects of non-uniform dielectric properties.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically utilize a number of components formed on printed circuit boards (PCBs). As processor speeds are increasing, the available signal timing margins for signals traveling through traces or buses formed on PCBs are decreasing in a corresponding fashion. Many of the current high speed buses are differential such that symmetry plays an important role in maximizing signal margins. Many currently available PCBs use FR4 material which is made from a woven fiberglass cloth filled with epoxy resin. The dielectric constant of the materials used to manufacture PCBs is not uniform. For instance, the dielectric constant of the fiberglass is higher compared to the dielectric constant of epoxy resin. This difference in dielectric constant often causes variations in the signal propagation delay due to the positioning of the traces formed on the PCB relative to the glass fiber. This variation in signal propagation delay is problematic when more than one trace (such as a differential pair) are used to transfer data from a transmitter module to a receiver module, because signals sent from the transmitter module at the same time arrive at the receiver module at different times.

Currently FR4 panels are manufactured such that the fibers are aligned to be either parallel or perpendicular to the edge of the panel and designers prefer routing parallel to the board edges. Typical FR4 uses approximately 600 fibers per inch and typical differential pairs use 5/5/5 routing such that timing skew often occurs on every differential pair of traces. If the signal in one trace of the differential pair is delayed relative to the signal in the other trace due to the asymmetry of the dielectric material experienced by each trace, common mode signals are created and several problems can arise including lower voltage in timing margins and an increased risk of Electromagnetic Interference (EMI).

SUMMARY OF THE INVENTION

Therefore a need has arisen for a system and method for minimizing the effects of non-uniform dielectric properties in Printed Circuit Board (PCB) materials.

The present disclosure describes a system and method for minimizing the effects of non-uniform dielectric properties by forming traces on printed circuit boards where the fibers within the printed circuit boards are non-rectangular with respect to the rectangular edges of the circuit board. In this manner the traces formed on the circuit boards in typical fashion will substantially minimize the effects of non-uniform dielectric properties on the printed circuit board because the traces are formed along a direction that is not parallel with respect to the fibers formed within the printed circuit board.

In one aspect, an information handling system is disclosed that includes a printed circuit board (PCB) having at least four substantially rectangular edges and formed from an epoxy resin laminate that has a first plurality of fibers disposed within the epoxy resin in a first direction and a second plurality of fibers disposed within the epoxy resin in a second direction, the second direction substantially perpendicular with respect to the first direction. A transmitter module and a receiver module are disposed on the PCB, connected by a first trace and a second trace formed on the PCB. The first trace and the second trace are each formed substantially along a third direction that is offset from both the first direction and the second direction.

In another aspect, a printed circuit board (PCB) includes four or more substantially rectangular edges and is formed from an epoxy resin laminate having a first plurality of fibers disposed within the epoxy resin in a first direction and a second plurality of fibers disposed within the epoxy in a second direction perpendicular with respect to the first direction. A transmitter module and a receiver module are disposed on the PCB and connected by a first trace and a second trace are formed on the PCB. The first trace and the second trace are each formed substantially along a third direction that is offset from the first direction and the second direction.

In yet another aspect A method of minimizing non-uniform dielectric properties in a printed circuit board (PCB) is disclosed that includes providing a printed circuit board (PCB) that has at least four substantially rectangular edges and is formed from an epoxy resin laminate. The PCB includes a first plurality of fibers disposed within the epoxy resin in a first direction and a second plurality of fibers disposed within the epoxy in a second direction substantially perpendicular with respect to the first direction. A transmitter module on the PCB and a receiver module on the PCB are disposed on the PCB. A first trace and a second trace are formed on the PCB with each trace connecting the transmitter module to the receiver module. The first trace and the second trace are formed substantially along a third direction offset from both the first direction and the second direction.

The present disclosure includes a number of important technical advantages. One technical advantage is forming a first and second trace on a printed circuit board in a third direction which is offset from the directions corresponding to the fibers formed within the printed circuit board. This allows for both traces to have an improved dielectric property uniformity. Additional advantages will be apparent to those of skill in the art and from the FIGURES, description and claims provided herein.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1-9 wherein like numbers refer to like and corresponding parts.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Figure 1:
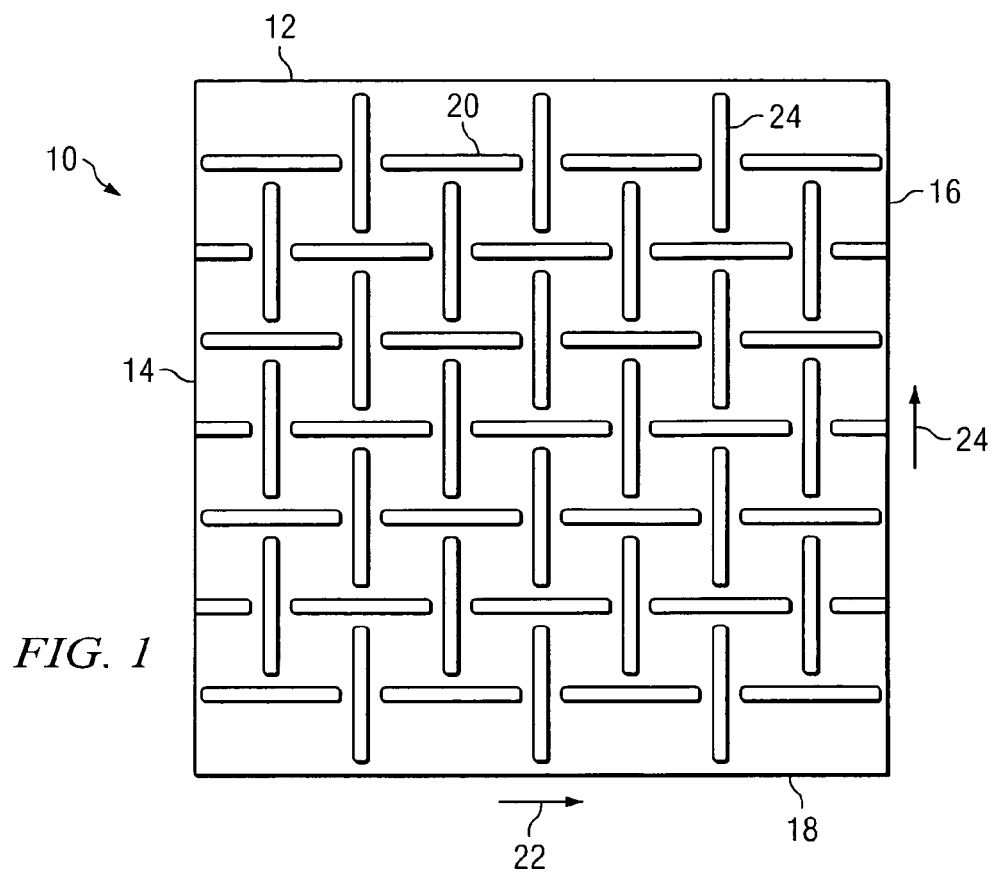
FIG. 1 shows a printed circuit board with fibers disposed in a rectangular orientation with respect to the edges of the printed circuit board.

Now referring to FIG. 1, a typical printed circuit board (PCB) 10 is shown. Typical PCB 10 includes first edge 12, second edge 14, third edge 16, and fourth edge 18. Each edge is formed in a generally rectangular orientation with respect to the other edges. PCB 10 includes a first plurality of fibers 20 and 24 that are formed within the printed circuit board material with a first plurality of fibers 20 disposed in resin in the direction of arrow 22. Arrow 22 is also substantially parallel to first edge 12 and fourth edge 18. Additionally a second plurality of fibers 24 is disposed within the printed circuit board material in the direction of second arrow 24. Second arrow 24 is substantially parallel with second edge 14 and third edge 16. Fibers 20 and 24 are glass fibers or another suitable fiber.

Figure 2:
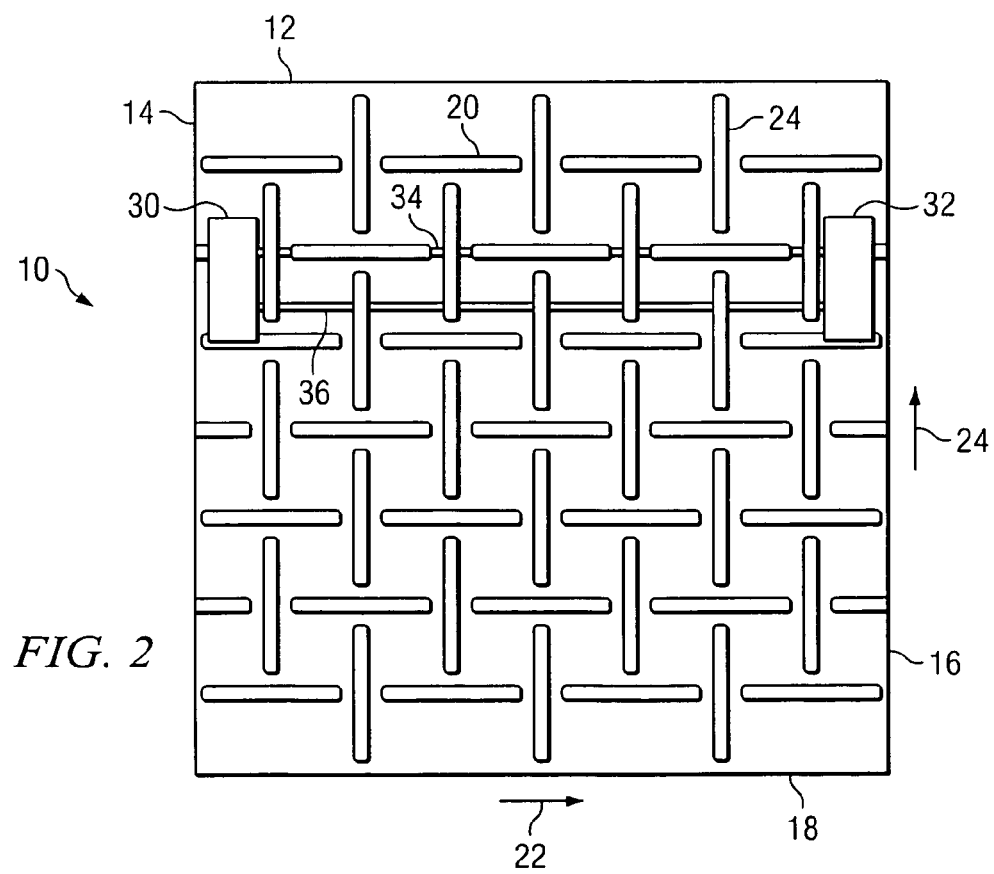
FIG. 2 shows a printed circuit board with fibers that are in a rectangular orientation with respect to the edges of the printed circuit board and also shows dual traces that are generally parallel with some of the fibers of the printed circuit board.

Now referring to FIG. 2 a typical printed circuit board 10 is shown with transmitter module 30 and receiver module 32 formed thereon. Transmitter module 30 is connected with receiver module 32 by first trace 34 and second trace 36. First trace 34 and second trace 36 form a differential pair for communicating information between transmitter module 30 and receiver module 32. First trace 34 and second trace 36 are formed on the surface of printed circuit board 10 and are generally parallel with respect to one another. As shown in the present embodiment, first trace 34 is formed in close relation to (in this case, directly over) a row of first plurality of fibers 20. Second trace 36 is formed parallel to, but offset from another row of the first plurality of fibers 20. Because of the difference in the position of first trace 34 and second trace 36 in relation to fibers 20, the speed of signals traveling along first and second traces 34 and 36 is different, thus resulting in signal skew, as discussed as follows. The resin material typically has a dielectric constant of approximately 3.1; fibers 20 and 24 are formed from a glass material and have a dielectric constant of approximately 6. Accordingly, the dielectric properties of the areas of PCB 10 along first trace 34 may differ substantially from the dielectric properties along second trace 36.

The dielectric constant relates to the signal speed according to formula below:

$$V_{signal\ speed} = \frac{V_c}{\sqrt{E_v}}$$

As shown above the $V_{signal\ speed}$ is equal to the signal speed along each respective trace 34 and 36. $V_c$ is equal to the speed of light and $E_v$ is the dielectric constant. In a particular example embodiment PCI express is utilized at five gigabytes per second (which equates to a period of approximately 400 picoseconds). First trace 34 which is disposed directly above a row of fibers has an average dielectric constant of approximately 3.7 whereas second trace 36 (which is somewhat offset from the rows of fibers) has an average dielectric constant of approximately 3.5. Accordingly the signal speed along first trace 34 is approximately 6.134 inches per nanosecond whereas the signal speed along second trace 36 is equal to approximately 6.307 inches per nanosecond. Assuming that first trace 34 and second trace 36 have a length of approximately 20 inches (such as might be found in a modular information handling system such as a blade server) the time for a signal to travel from transmitter 30 to receiver 32 along first trace 34 would be approximately 3.260 nanoseconds; the time it would take for a signal to travel from transmitter module 30 to receiver module 32 along second trace 36 would be approximately 3.171 nanoseconds. The skew between first trace 34 and second trace 36 is approximately 89 picoseconds which is equivalent to approximately 22 percent of the 400 picosecond period of this example. Accordingly, for systems operating at higher speeds or having traces running longer distances, skew resulting from non-uniform dielectric constant will have a more severe effect for systems operating at slower speeds and having shorter traces, signal skew due to non-uniform dielectric properties will likely be less pronounced.

Figure 3:
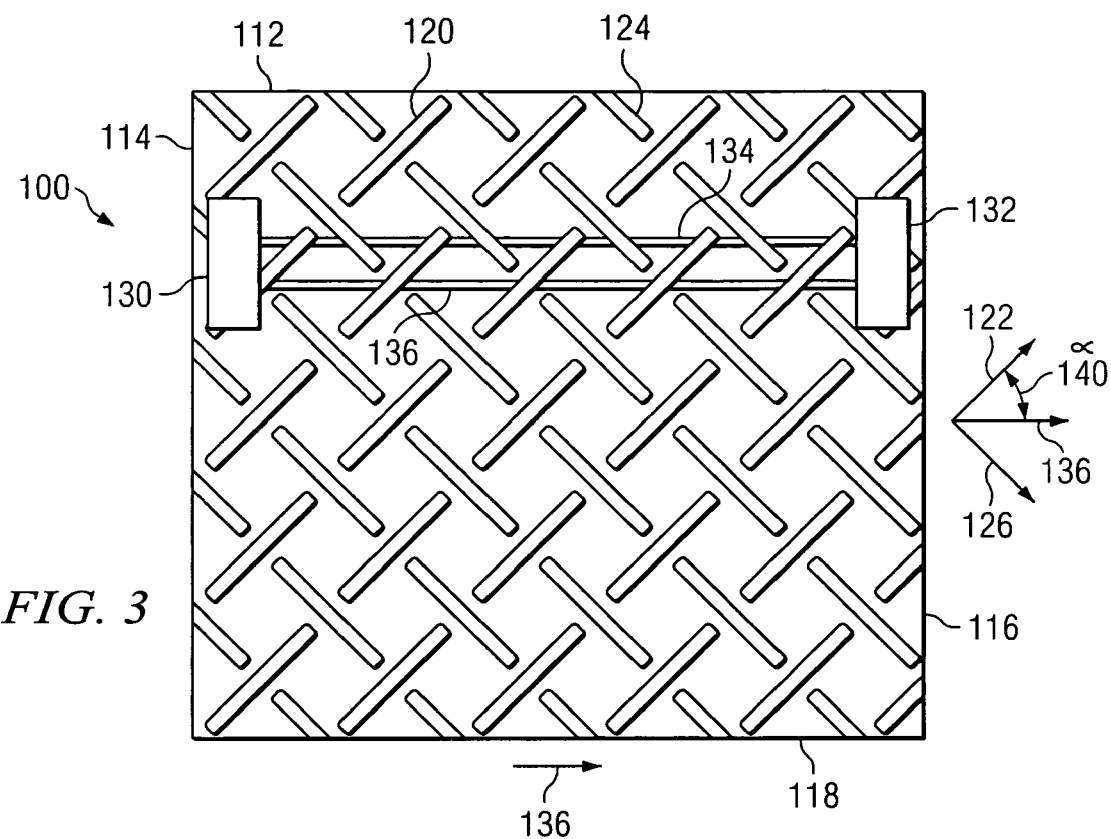
FIG. 3 shows a printed circuit board according to the present disclosure showing traces formed on the printed circuit board in a direction that is offset from the direction of the fibers within the printed circuit board.

Now referring to FIG. 3 a PCB indicated generally at 100 according to the present disclosure is shown. PCB 100 includes first edge 112, second edge 114, third edge 116, and fourth edge 118. In alternate embodiments, PCB 100 may include additional sides such that PCB 100 may have an L-shape or may otherwise have a shape that is not that of a rectangle (but have multiple sides that meet at substantially right angles). Accordingly, PCBs according to the present disclosure will have at least two sides that have a rectangular (approximately right angle) orientation with respect to one another. However, the present disclosure contemplates PCBs that have a shape that is non-rectangular including but not limited to L-shaped PCBs or rectangle-shaped PCBs that have notches or other portions removed therefrom.

PCB 100 includes first plurality of fibers 120 formed in the direction of arrow 122 and second plurality of fibers 124 formed in the direction of arrow 126. As shown, first plurality of fibers 120 and second plurality fibers 124 are arranged such that they are offset from the direction of edges 112, 114, 116 and 118. In the present embodiment first plurality of fibers 120 and second plurality of fibers 124 are offset by an angle alpha (x) which is approximately 45 degrees from direction 136 (the approximate direction of first edge 112 and second edge 136). As described further below, in alternate embodiments, fibers 120 and 124 may be offset at a variety of suitable angles.

Transmitter module 130 and receiver module 132 are formed on opposite sides of PCB 100 and connected by first trace 134 and second trace 136. Transmitter module 130 may encompass any component operable to send signals to receiver module 132 via differential pair of traces 134 and 136. Receiver module encompasses any component operable to receive signals form differential pair 134 and 136. First trace 134 and second trace 136 are substantially parallel and both may transmit signals between transmitter module 130 and receiver module 132. First trace 134 and second trace 236 are further formed in direction of arrow 136 which also corresponds with first edge 112 and second edge 114. First trace 134 and second trace 136 are disposed along PCB such that both traces have a more uniform average or overall dielectric constant because the proximity of each trace to glass fibers 120 and 124 is more uniform due to the offset orientation of first plurality of fibers 120 and second plurality of fibers 124. Stated another way, because first trace 134 and second trace 136 are formed over fibers 120 and 124 that have been formed at an offset orientation the length of the traces have similar exposure to the varying dielectric properties of PCB 100 which reduces trace skew between traces 134 and 136.

The present embodiment may be formed by manufacturing printed circuit boards (such as printed circuit boards manufactured of FR4 material) using fiberglass cloth that has been set at an offset angular orientation such as a 45 degree orientation or another suitable offset angle. A second way to obtain the offset orientation of fibers 120 and 124 is to manufacture printed circuit board materials with the fiberglass cloth at a more typical rectangular orientation but then to cut printed circuit boards at an angular offset. This second solution may increase PCB waste because portions of printed circuit board materials may not be usable after printed circuit boards have been cut at an offset angle.

In one particular embodiment printed circuit board 100 may preferably be utilized as a midplane for use with a modular information handling system such as a blade server.

Figure 4:
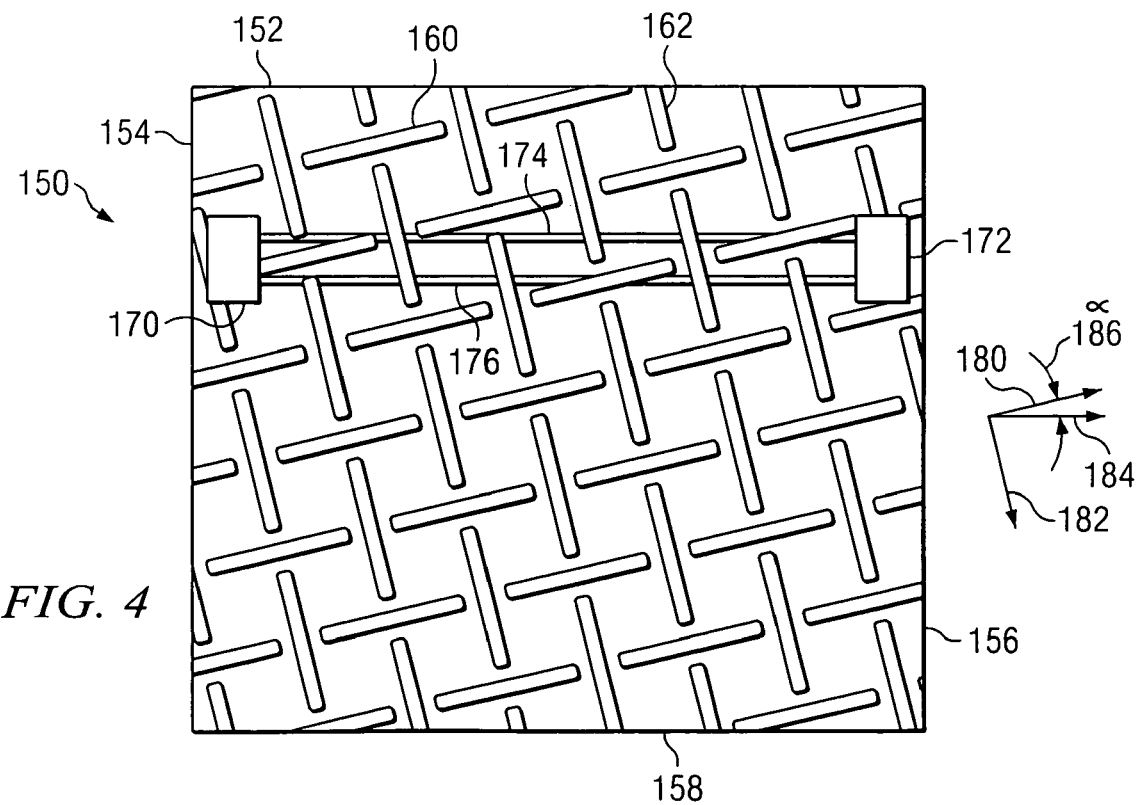
FIG. 4 shows another embodiment according to the present disclosure showing traces formed on a printed circuit board and offset from the direction of fibers formed within the printed circuit board.

Now referring to FIG. 4 a printed circuit board 150 according to the present disclosure is shown. Printed circuit board 150 includes first edge 152, second edge 154, third edge 156, and fourth edge 158. The printed circuit board 150 includes a first plurality of fibers formed within PCB 150 in direction 180 and a second plurality of fibers 162 formed in direction 182. In the present embodiment first direction 180 is offset from the horizontal direction 184 (which corresponds with first edge 152 and fourth edge 158 by an offset angle of alpha 186). In one embodiment, angle alpha 186 is at least ten degrees. In another embodiment alpha angle 186 may be at least thirty degrees.

The selection of alpha angle 186 may be influenced by the amount of waste created when forming printed circuit board 150, the density of the plurality of fibers, the variation in dielectric constant due to the weave of fibers 160 and 162, and the length of first trace 174 and second trace 176.

Transmitter module 170 and receiving module 172 are formed on PCB 150. The first trace 174 and second trace 176 connect transmitter module 170 with receiving module 172 and are approximately parallel. First trace 174 and second trace 176 are also formed in the direction of arrow 184 and are substantially parallel with first edge 152 and fourth edge 158. As described above, the orientation of traces 174 and 176 with respect to the fibers 160 and 162 (set at offset angles) allows first trace 174 and second trace 176 to have similar dielectric properties and reduce the disadvantages associated with PCB with rectangular fiber orientation.

Figure 5:
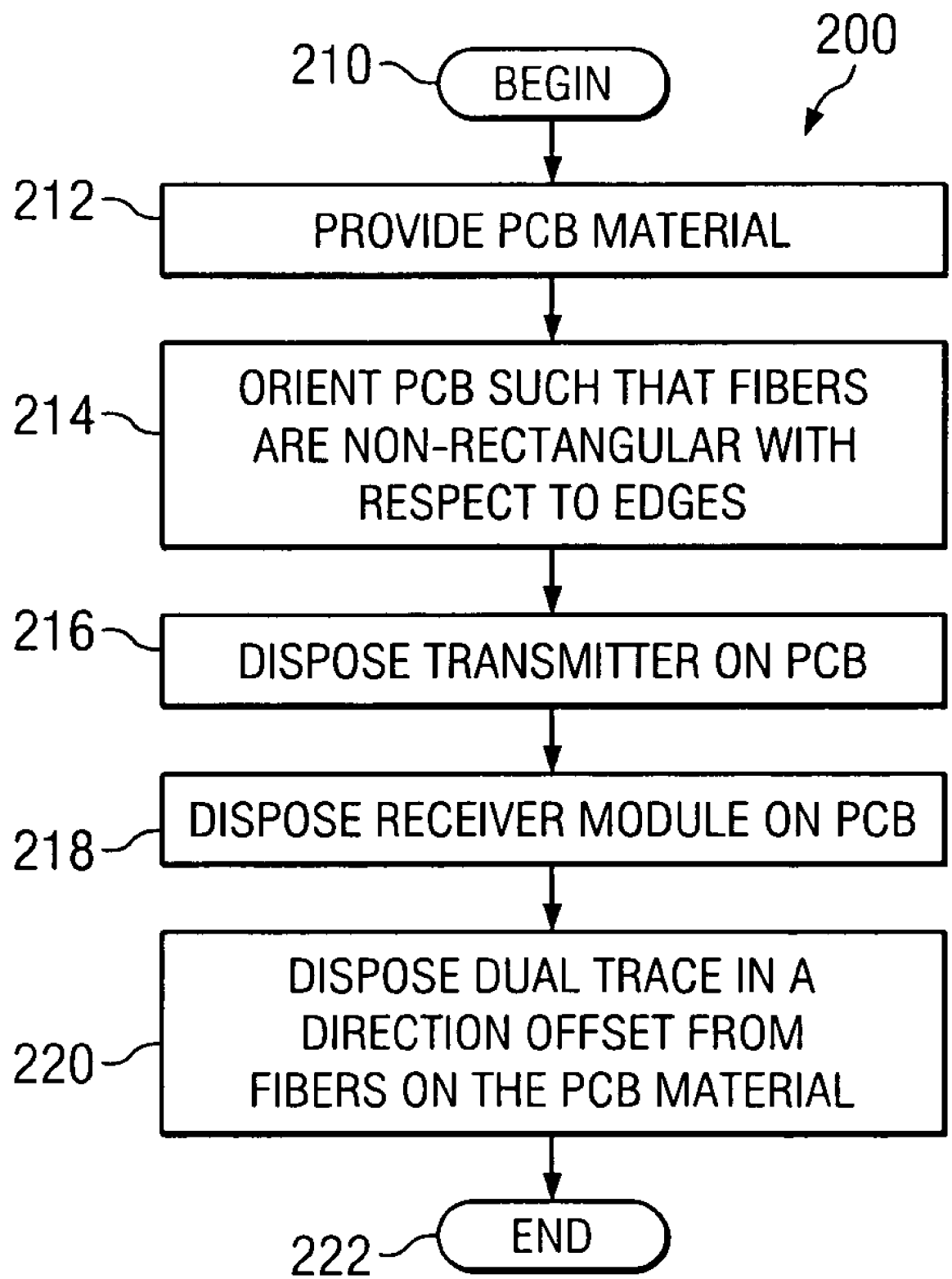
FIG. 5 shows a flow diagram showing a simplified method for constructing a printed circuit board according to teachings of the present disclosure.

Now referring to FIG. 5 a flow chart depicted generally at 200 showing a method according to the present invention is shown. The method begins at 210 by first providing a printed circuit board material 212. Next the printed circuit board material is oriented such that the fibers are aligned in a non-rectangular orientation with respect to the edges of the printed circuit board element that is to be cut 214. Next a transmitter module is formed on the PCB 216. A receiver module is then formed on the PCB 218. A dual trace is informed on the PCB connecting the transmitter module and the receiver module 220. The dual trace or differential pair is preferably formed in a direction that is offset from the fibers of the PCB material such that the traces are evenly exposed to varying dielectric constant due to variations in the dielectric constant of the PCB material such that the dielectric constant over the course of each trace is substantially equal.

Although the disclosed embodiments have been described in detail, it should be understood that various changes, substitutions and alterations can be made to the embodiments without departing from their spirit and scope

What is claimed is:

1. An information handling system comprising:
 a printed circuit board (PCB) having at least four substantially rectangular edges and formed from an epoxy resin laminate having a first plurality of generally electrically non-conductive fibers disposed within the epoxy resin in a first direction and a second plurality of generally electrically non-conductive fibers disposed within the epoxy resin in a second direction, the second direction substantially perpendicular with respect to the first direction;
 a transmitter module disposed on the PCB;
 a receiver module disposed on the PCB; and
 a first electrically conductive trace and a second electrically conductive trace formed on the PCB connecting the transmitter module and the receiver module, the first electrically conductive trace and the second electrically conductive trace each formed substantially along a third direction offset from the first direction and the second direction of the generally electrically non-conductive fibers.

2. The information handling system of claim 1 wherein the third direction is offset approximately forty-five degrees from the first direction.

3. The information handling system of claim 1 further comprising the third direction generally parallel with an edge of the PCB.

4. The information handling system of claim 1 further comprising the third direction offset at least ten degrees from the first direction.

5. The information handling system of claim 1 further comprising the third direction offset at least thirty degrees from the first direction.

6. The information handling system of claim 1 further comprising the PCB formed from FR4 material.

7. The information handling system of claim 1 further comprising the offset angle selected to minimize non-uniformity of the dielectric properties between the first trace and the second trace.

8. A printed circuit board (PCB) having at least four substantially rectangular edges and formed from an epoxy laminate having a first plurality of generally electrically non-conductive fibers disposed within the epoxy in a first direction and a second plurality of generally electrically non-conductive fibers disposed within the epoxy in a second direction, the second direction substantially perpendicular with respect to the first direction;
 a transmitter module disposed on the PCB;
 a receiver module disposed on the PCB; and
 a first trace and a second trace formed on the PCB and connecting the transmitter module and the receiver module, the first trace and the second trace each formed substantially along a third direction offset from the first direction and the second direction of the generally electrically non-conductive fibers.

9. The printed circuit board of claim 8 wherein the third direction is offset approximately forty-five degrees from the first direction.

10. The printed circuit board of claim 8 further comprising the third direction generally parallel with an edge of the PCB.

11. The printed circuit board of claim 8 further comprising the third direction offset at least ten degrees from the first direction.

12. The printed circuit board of claim 8 further comprising the third direction offset at least thirty degrees from the first direction.

13. The printed circuit board of claim 8 further comprising the PCB formed from FR4 material.

14. The printed circuit board of claim 8 further comprising the offset angle selected to minimize non-uniformity of the dielectric properties between the first trace and the second trace.

15. A method of minimizing non-uniform dielectric properties in a printed circuit board (PCB) comprising:
 providing a printed circuit board (PCB) having at least four substantially rectangular edges and formed from an epoxy laminate having a first plurality of generally electrically non-conductive fibers disposed within the epoxy in a first direction and a second plurality of generally electrically non-conductive fibers disposed within the epoxy in a second direction, the second direction substantially perpendicular with respect to the first direction;
 disposing a transmitter module on the PCB;
 disposing a receiver module on the PCB; and
 forming a first trace and a second trace on the PCB, each trace connecting the transmitter module to the receiver module, the first trace and the second trace each formed substantially along a third direction offset from both the first direction and the second direction of the generally electrically non-conductive fibers.

16. The method of claim 15 further comprising the third direction offset from the first direction by approximately forty-five (45) degrees.

17. The method of claim 15 further comprising the third direction offset from the first direction by at least thirty (30) degrees.

18. The method of claim 15 further comprising the third direction offset from the first direction by at least ten (10) degrees.

* * * * *